(12) United States Patent
Cheng et al.

(10) Patent No.: US 9,196,637 B1
(45) Date of Patent: Nov. 24, 2015

(54) ARRAY SUBSTRATE AND DISPLAY DEVICE

(71) Applicant: BOE TECHNOLOGY GROUP CO., LTD., Beijing (CN)

(72) Inventors: Hongfei Cheng, Beijing (CN); Yong Qiao, Beijing (CN); Jianbo Xian, Beijing (CN); Wenbo Li, Beijing (CN); Pan Li, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/549,086

(22) Filed: Nov. 20, 2014

(30) Foreign Application Priority Data

Jun. 12, 2014 (CN) .................... 2014 2 0313509 U

(51) Int. Cl.
*H01L 27/12* (2006.01)
(52) U.S. Cl.
CPC .................... *H01L 27/124* (2013.01)
(58) Field of Classification Search
CPC .................................................... H01L 27/124
See application file for complete search history.

(56) References Cited

U.S. PATENT DOCUMENTS

| 2010/0207846 A1* | 8/2010 | Na ............... G02F 1/13624 345/55 |
| 2013/0076600 A1* | 3/2013 | Park ............ G02F 1/136286 345/55 |

* cited by examiner

*Primary Examiner* — Marc Armand
*Assistant Examiner* — Wasiul Haider
(74) *Attorney, Agent, or Firm* — Baker Hostetler LLP

(57) ABSTRACT

The present disclosure provides an array substrate and a display device. The array substrate includes gate lines, data lines, and thin film transistors (TFTs) connected to the gate lines and the data lines. At least one of the data lines is divided into a first branch and a second branch at a predetermined region where an intersection of the at least one of the data lines and at least one of the gate lines is located. The first branch overlaps the at least one of the gate lines, and has a width less than a width of a non-overlapping portion of the at least one of the data lines which does not overlap the at least one of the gate lines. The second branch overlaps a gate electrode of a corresponding one of the TFTs, and serves as, or is connected to, a source electrode of the corresponding TFT.

19 Claims, 3 Drawing Sheets

ARRAY SUBSTRATE AND DISPLAY DEVICE

CROSS-REFERENCE TO RELATED APPLICATION

The present application claims a priority of the Chinese patent application No. 201420313509.7 filed on Jun. 12, 2014, which is incorporated herein by reference in its entirety.

FIELD OF THE INVENTION

The present disclosure relates to the field of display technology, in particular to an array substrate and a display device.

DESCRIPTION OF THE PRIOR ART

Liquid crystal display technology has been widely used in TVs, mobile telephones and public information distributed systems. A liquid crystal display panel includes an array substrate and a color film substrate arranged opposite to each other to form a cell. The array substrate includes a plurality of gate lines and a plurality of data lines that intersect with each other. A coupling capacitance, present at an overlapping portion between the gate line and the data line, will adversely affect the transmission of a gate line signal and a data line signal, and thus deteriorate the display quality. Along with an increasing size of the display panel, such a situation grows steadily worse.

SUMMARY OF THE INVENTION

In view of this, the present disclosure provides an array substrate and a display device, which can reduce a coupling capacitance at an overlapping region between a gate line and a data line.

In order to solve the above technical problem, one embodiment of the present disclosure provides an array substrate including a plurality of gate lines, a plurality of data lines intersecting with the gate lines, and a plurality of thin film transistors (TFTs) connected to the gate lines and the data lines. At least one of the data lines is divided into a first branch and a second branch at a predetermined region where an intersection of the at least one of the data lines and at least one of the gate lines is located. The first branch overlaps the at least one of the gate lines; the first branch has a width less than a width of a non-overlapping portion of the at least one of the data lines which does not overlap the at least one of the gate lines. The second branch overlaps a gate electrode of a corresponding one of the TFTs, and serves as, or is connected to, a source electrode of the corresponding TFT.

Further, the second branch has a width less than the width of the non-overlapping portion of the at least one of the data lines which does not overlap the at least one of the gate lines.

Further, the at least one of the gate lines includes a thinning portion; the thinning portion overlaps the first branch; the thinning portion has a width less than a width of a non-overlapping portion of the at least one of the gate lines that does not overlap the at least one of the data lines.

Further, the at least one of the gate lines is provided with a widening portion; the widening portion has a width greater than the width of the non-overlapping portion of the at least one of the gate lines that does not overlap the at least one of the data lines; the widening portion overlaps the second branch as the gate electrode of the corresponding TFT. A part of the widening portion is located in the gap between the first branch and the second branch.

Further, the widening portion and the thinning portion are arranged in abutment with each other.

Further, the at least one of the gate lines extends in a first direction, the at least one of the data lines extends in a second direction perpendicular to the first direction; the widening portion and the thinning portion are arranged in abutment with each other in the first direction.

Further, a region is defined between an edge of the first branch which is located adjacent to the second branch and an extension line of an edge of the non-overlapping portion of the at least one of the data lines which does not overlap the at least one of the gate lines and which is located adjacent to the second branch, and a part of the widening portion is located in the region.

Further, the region is located within the gap.

Further, a first end of the second branch is connected to a first end of the first branch, and a second end of the second branch is connected to a second end of the first branch.

Further, a first end of the second branch is connected to a first end of the first branch, and a second end of the second branch is not connected to a second end of the first branch.

One embodiment of the present disclosure provides a display device including the above-mentioned array substrate.

The present disclosure has following advantageous effect. The first branch of the data line overlaps the gate line, and the second branch overlaps the gate electrode of the TFT. Since the width of the first branch is less than the width of the non-overlapping portion of the data line that does not overlap the gate line, thus, an area of an overlapping region between the data line and the gate line may be reduced and the coupling capacitance therebetween may be reduced, thereby improving a display effect of the display device including the array substrate.

DETAILED DESCRIPTION OF THE PREFERRED EMBODIMENTS

Figure 1:
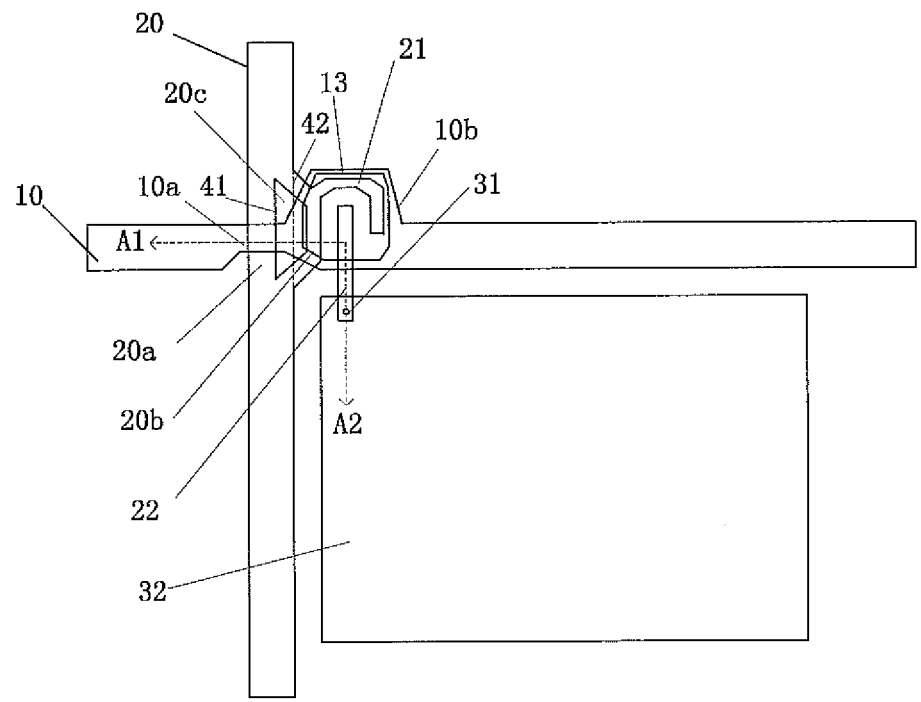
FIG. 1 is a schematic view showing an array substrate according to one embodiment of the present disclosure.

In order to prevent a display effect of a display panel from being adversely affected due to signal delay caused by the coupling capacitance present at an overlapping portion between a gate line and a data line in an existing array substrate, one embodiment of the present disclosure provides an array substrate including a plurality of gate lines, a plurality of data lines intersecting with the gate lines, and a plurality of TFTs connected to the gate lines and the data lines. The data line is divided into a first branch and a second branch at a predetermined region where an intersection of the data line and the gate line is located. The first branch overlaps the gate line. The first branch has a width less than a width of a non-overlapping portion of the data line which does not overlap the gate lines. The second branch overlaps a gate electrode of the TFT, and serves as, or is connected to, a source electrode of the TFT.

The predetermined region where the intersection of the data line and the gate line refers to an overlapping region between the data line and the gate line, or a region adjacent to the overlapping region.

The non-overlapping portion of the data line that does not overlap the gate line refers to a portion of the data line rather than the first branch and the second branch.

In one embodiment, the first branch of the data line overlaps the gate line and the second branch overlaps the gate electrode of the TFT, i.e., an actual overlapping region between the data line and the gate line is an overlapping region between the first branch and the gate line. Since the width of the first branch is less than a width of the non-overlapping portion of the data line that does not overlap the gate line, thus, an area of the overlapping region between the data line and the gate line may be reduced and the coupling capacitance between the data line and the gate line may be reduced, thereby improving a display effect of a display device including the array substrate of one embodiment of the present disclosure.

In one embodiment of the present disclosure, the second branch of the data line overlaps the gate electrode of the TFT, and serves as, or is connected to, the source electrode of the TFT. Optionally, the second branch of the data line has a width less than the width of the non-overlapping portion of the data line that does not overlap the gate line, so as to reduce the coupling capacitance between the gate electrode and the source electrode of the TFT.

In order to further reduce the area of the overlapping region between the data line and the gate line, optionally, the gate line includes a thinning portion. The thinning portion overlaps the first branch. The thinning portion has a width less than a width of a non-overlapping portion of the gate line that does not overlap the data line.

Optionally, the gate line is provided with a widening portion. The widening portion has a width greater than the width of the non-overlapping portion of the gate line that does not overlap the data line. The widening portion overlaps the second branch as the gate electrode of the TFT. A part of the widening portion is located in a gap between the first branch and the second branch.

Further, a region is formed between an edge of the first branch which is located adjacent to the second branch and an extension line of an edge of the non-overlapping portion of the data line which does not overlap the gate line and which is located adjacent to the second branch, and a part of the widening portion is located in the region, so as to reduce an area of a pixel region occupied by the TFT, thereby increasing an aperture ratio of a pixel and further improving the display effect of the display device.

In order to make the objects, the technical solutions and the advantages of the present disclosure more apparent, the present disclosure will be described hereinafter in conjunction with the drawings and the embodiments.

Figure 2:
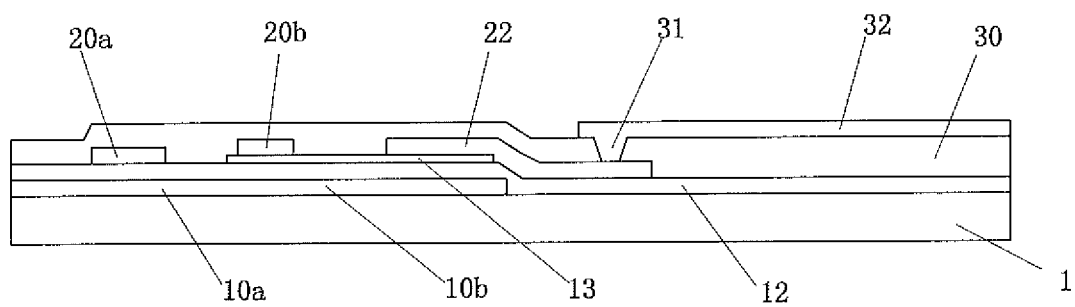
FIG. 2 is a sectional view of the array substrate taken along a line A1-A2 in FIG. 1.
Figure 4:
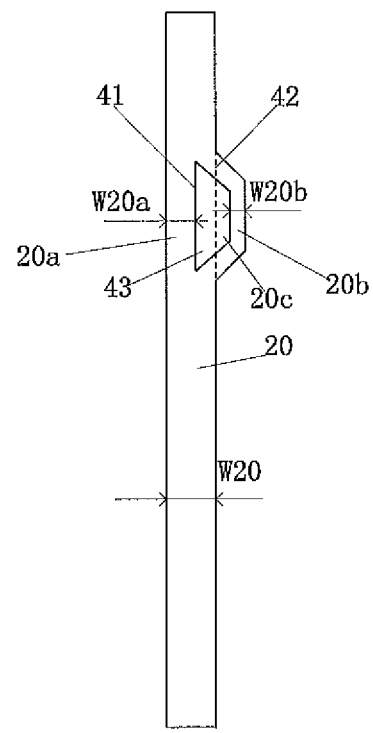
FIG. 4 is a schematic view showing a data line according to one embodiment of the present disclosure.
Figure 5:
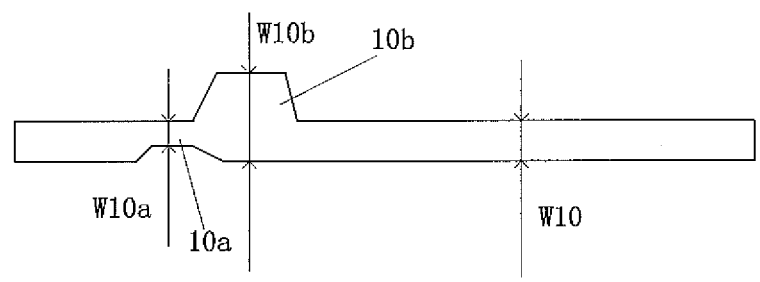
FIG. 5 is a schematic view showing a gate line according to one embodiment of the present disclosure.

FIG. 1 is a schematic view showing an array substrate according to one embodiment of the present disclosure. FIG. 2 is a sectional view of the array substrate taken along a line A1-A2 in FIG. 1. FIG. 4 is a schematic view showing a data line according to one embodiment of the present disclosure. FIG. 5 is a schematic view showing a gate line according to one embodiment of the present disclosure.

The array substrate includes a plurality of gate lines 10, a plurality of data lines 20 intersecting with the gate lines 10, and a plurality of TFTs connected to the gate lines 10 and the data lines 20.

The data line 20 is divided into a first branch 20a and a second branch 20b at a predetermined region where an intersection of the data line 20 and the gate line 10 is located. A first end of the second branch 20b is connected to a first end of the first branch 20a, and a second end of the second branch 20b is connected to a second end of the first branch 20a. In other words, as viewed from top to bottom when the array substrate is located at position shown in FIG. 1, the data line 20 is divided into the first branch 20a and the second branch 20b at a part of the data line 20 adjacent to the intersection of the data line 20 and the gate line 10; and the first branch 20a and the second branch 20b converge after they pass through the intersection. Of course, in another embodiment of the present disclosure, the first branch 20a and the second branch 20b may not converge after they pass through the intersection, i.e., the first end of the second branch 20b is connected to the first end of the first branch 20a, and the second end of the second branch 20b is not connected to the second end of the first branch 20a.

As viewed from left to right when the array substrate is located at the position shown in FIG. 1, the gate line 10 is thinned at a part of the gate line 10 adjacent to the intersection of the gate line 10 and the data line 20, thereby forming a thinning portion 10a. The thinning portion 10a overlaps the first branch 20a. In a gap 20c between the first branch 20a and the second branch 20b of the data line 20, a part of the gate line 10 is thickened, thereby forming a widening portion 10b. In other words, a part of the widening portion 10b is located in the gap 20c between the first branch 20a and the second branch 20b. The widening portion 10b overlaps the second branch 20b as the gate electrode of the TFT.

In this embodiment, a region 43 is formed between an edge 41 of the first branch 20a which is located adjacent to the second branch 20b and an extension line 42 of an edge of the non-overlapping portion of the data line 20 which does not overlap the gate line 10 and which is located adjacent to the second branch 20b, and a part of the widening portion 10b is located in the region 43, so as to reduce the area of the pixel region occupied by the TFT and increase the aperture ratio of the pixel, thereby further improving the display effect of the display device.

Referring to FIG. 4, both of a width W20a of the first branch 20a and a width W20b of the second branch 20b are less than a width W20 of the non-overlapping portion of the data line 20 that does not overlap the gate line 10.

Referring to FIG. 5, a width W10a of the thinning portion 10a is less than a width W10 of the non-overlapping portion of the gate line 10 that does not overlap the data line 20. A width W10b of the widening portion 10b is greater than the width W10 of the non-overlapping portion of the gate line 10 that does not overlap the data line 20.

The TFT includes the gate electrode, an active layer 13, a source electrode 21 and a drain electrode 22. The gate electrode of the TFT is just the widening portion 10b, and the source electrode 21 thereof is connected to the second branch 20b of the data line.

In this embodiment, the TFT includes a U-shaped channel. Since the U-shaped channel has a large width to length ratio, thus the TFT has a large on-state current.

The array substrate further includes a base plate 1, a gate insulating layer 12 and a pixel electrode 32. The pixel electrode 32 is in electrical connection with the drain electrode 32 through a via-hole 31.

Figure 3:
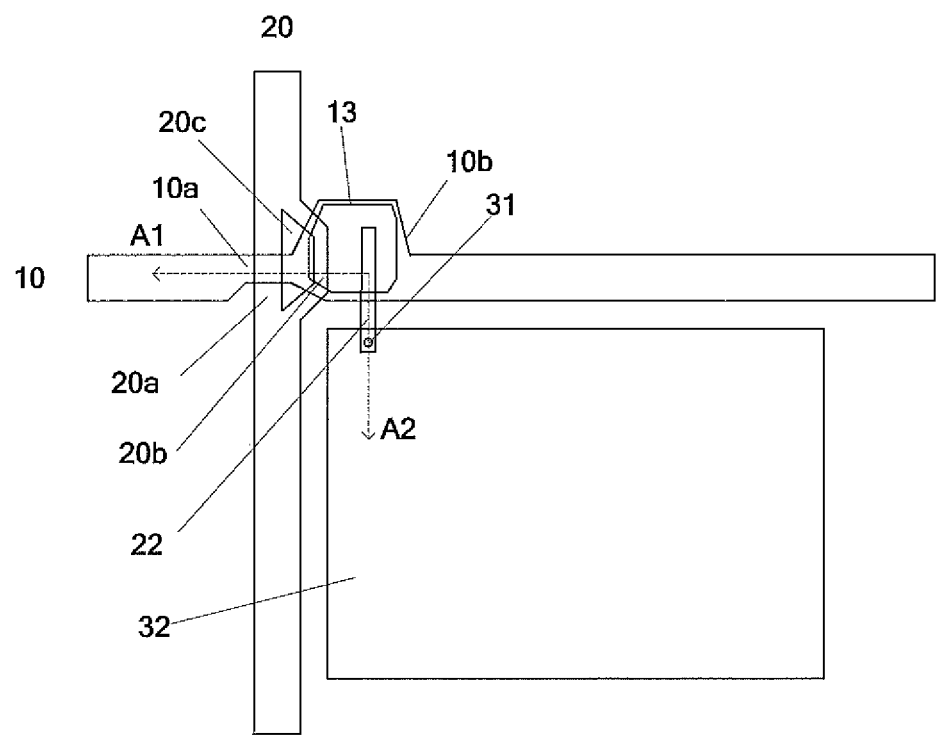
FIG. 3 is a schematic view showing an array substrate according to another embodiment of the present disclosure.

FIG. 3 is a schematic view showing an array substrate according to another embodiment of the present disclosure. The array substrate in this embodiment differs from that in the previous embodiment in that the second branch 20b of the data line is directly used as the source electrode of the TFT, i.e., a portion indicated by the reference sign 21 in FIG. 1 is omitted.

In the above embodiments, the gate line 10 and the data line 20 may be made of a metallic material such as Cu, Al, Mo, Ti, Cr and W, or an alloy thereof. The gate line 10 may be of a single-layered structure or a multi-layered structure, e.g., Mo/Al/Mo, Ti/Cu/Ti or Mo/Ti/Cu.

In the above embodiments, the gate insulating layer 12 may be made of SiN or SiO. The gate insulating layer 12 may be of a single-layered structure or a multi-layered structure, e.g., SiO/SiN.

In the above embodiments, the active layer 13 may be made of amorphous silicon, polycrystalline silicon, microcrystalline silicon or an oxide semiconductive material.

In the above embodiments, the array substrate may further include a passivation layer 30 made of an inorganic matter such as SiN.

In the above embodiments, the pixel electrode 32 may be made of ITO, IZO, or any other transparent metal oxide conductive material.

A method for manufacturing the array substrate will be described hereinafter in conjunction with FIG. 2. The method includes steps of:

(1) depositing a metal layer, e.g., Al, on the base plate 1 by sputtering, applying a photoresist onto the metal layer, and exposing, developing and etching the photoresist so as to form a pattern of the gate line 10;

(2) depositing the gate insulating layer 12, e.g., SiN, by PECVD;

(3) depositing a semiconductor layer, e.g., continuously depositing a-Si and n+a-Si by PECVD or depositing IGZO by sputtering, applying a photoresist onto the semiconductor layer, and exposing, developing and etching the photoresist so as to form a pattern of the active layer 13; and (4) depositing a metal layer, e.g., Al, by sputtering, applying a photoresist onto the metal layer, and exposing, developing and etching the photoresist to form patterns of the data line 20, the source electrode 21 and the drain electrode 22.

The method may further include steps of:

(5) depositing the passivation layer 30, e.g., SiN, by PECVD, applying a photoresist onto the passivation layer 30, and exposing, developing and etching the photoresist to form the via-hole 31 through which the drain electrode 22 of a first TFT is exposed; and (6) depositing a layer of a transparent metal oxide conductive material, e.g., ITO, by sputtering, applying a photoresist onto the layer, and exposing, developing and etching the photoresist to form a pattern of the pixel electrode 32.

The present disclosure further provides a display device including the above-mentioned array substrate.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. An array substrate, comprising a plurality of gate lines, a plurality of data lines intersecting with the gate lines, and a plurality of thin film transistors (TFTs) connected to the gate lines and the data lines, wherein at least one of the data lines is divided into a first branch and a second branch at a predetermined region where an intersection of the at least one of the data lines and at least one of the gate lines is located;

the first branch overlaps the at least one of the gate lines; the first branch has a width less than a width of a non-overlapping portion of the at least one of the data lines which does not overlap the at least one of the gate lines, and the second branch overlaps a gate electrode of a corresponding one of the TFTs, and serves as, or is connected to, a source electrode of the corresponding TFT;

wherein a first end of the second branch is connected to a first end of the first branch, and a second end of the second branch is connected to a second end of the first branch.

2. The array substrate according to claim 1, wherein the second branch has a width less than the width of the non-overlapping portion of the at least one of the data lines which does not overlap the at least one of the gate lines.

3. The array substrate according to claim 1, wherein a gap is defined between the first branch and the second branch.

4. The array substrate according to claim 3, wherein the at least one of the gate lines is provided with a widening portion; the widening portion has a width greater than a width of a non-overlapping portion of the at least one of the gate lines that does not overlap the at least one of the data lines; the widening portion overlaps the second branch as the gate electrode of the corresponding TFT, and a part of the widening portion is located in the gap between the first branch and the second branch.

5. The array substrate according to claim 1, wherein the at least one of the gate lines comprises a thinning portion; the thinning portion overlaps the first branch; the thinning portion has a width less than a width of a non-overlapping portion of the at least one of the gate lines that does not overlap the at least one of the data lines.

6. The array substrate according to claim 5, wherein there is a gap defined between the first branch and the second branch.

7. The array substrate according to claim 6, wherein the at least one of the gate lines is provided with a widening portion; the widening portion has a width greater than the width of the non-overlapping portion of the at least one of the gate lines that does not overlap the at least one of the data lines; the widening portion overlaps the second branch as the gate electrode of the corresponding TFT; and a part of the widening portion is located in the gap between the first branch and the second branch.

8. The array substrate according to claim 7, wherein the widening portion and the thinning portion are arranged in abutment with each other.

9. The array substrate according to claim 7, wherein the at least one of the gate lines extends in a first direction, the at least one of the data lines extends in a second direction perpendicular to the first direction; the widening portion and the thinning portion are arranged in abutment with each other in the first direction.

10. The array substrate according to claim 7, wherein a region is defined between an edge of the first branch which is located adjacent to the second branch and an extension line of an edge of the non-overlapping portion of the at least one of the data lines which does not overlap the at least one of the gate lines and which is located adjacent to the second branch, and a part of the widening portion is located in the region.

11. Array substrate according to claim 10, wherein the region is located within the gap.

12. A display device, comprising an array substrate, wherein the array substrate comprises a plurality of gate lines, a plurality of data lines intersecting with the gate lines, and a plurality of thin film transistors (TFTs) connected to the gate lines and the data lines, and wherein
- at least one of the data lines is divided into a first branch and a second branch at a predetermined region where an intersection of the at least one of the data lines and at least one of the gate lines is located;
- the first branch overlaps the at least one of the gate lines; the first branch has a width less than a width of a non-overlapping portion of the at least one of the data lines which does not overlap the at least one of the gate lines, and
- the second branch overlaps a gate electrode of a corresponding one of the TFTs, and serves as, or is connected to, a source electrode of the corresponding TFT;
- wherein a first end of the second branch is connected to a first end of the first branch, and a second end of the second branch is connected to a second end of the first branch.

13. The display device according to claim 12, wherein a gap is defined between the first branch and the second branch.

14. The display device according to claim 13, wherein the at least one of the gate lines is provided with a widening portion; the widening portion has a width greater than a width of a non-overlapping portion of the at least one of the gate lines that does not overlap the at least one of the data lines; the widening portion overlaps the second branch as the gate electrode of the corresponding TFT, and
- a part of the widening portion is located in a gap between the first branch and the second branch.

15. The display device according to claim 14, wherein the at least one of the gate lines comprises a thinning portion; the thinning portion overlaps the first branch; the thinning portion has a width less than the width of the non-overlapping portion of the at least one of the gate lines that does not overlap the at least one of the data lines.

16. The display device according to claim 15, wherein the at least one of the gate lines extends in a first direction, the at least one of the data lines extends in a second direction perpendicular to the first direction, and the widening portion and the thinning portion are arranged in abutment with each other in the first direction.

17. The display device according to claim 14, wherein the corresponding TFT further comprises a drain electrode, and
- the array substrate further comprises a pixel electrode corresponding to the corresponding TFT and in electrical connection to the drain electrode.

18. An array substrate, comprising a plurality of gate lines, a plurality of data lines intersecting with the gate lines, and a plurality of thin film transistors (TFTs) connected to the gate lines and the data lines, wherein
- at least one of the data lines is divided into a first branch and a second branch at a predetermined region where an intersection of the at least one of the data lines and at least one of the gate lines is located;
- the first branch overlaps the at least one of the gate lines; the first branch has a width less than a width of a non-overlapping portion of the at least one of the data lines which does not overlap the at least one of the gate lines, and
- the second branch overlaps a gate electrode of a corresponding one of the TFTs, and serves as, or is connected to, a source electrode of the corresponding TFT;
- wherein a gap is defined between the first branch and the second branch;
- wherein the at least one of the gate lines comprises a first portion, a second portion and a third portion;
- the first portion does not overlap the at least one of the data lines and has a first width;
- the second portion has a second width greater than the first width; the second portion overlaps the second branch as the gate electrode of the corresponding TFT, and a part of the second portion is located in the gap between the first branch and the second branch;
- the third portion overlaps the first branch; the third portion has a third width less than the first width.

19. The array substrate according to claim 18, wherein a first end of the second branch is connected to a first end of the first branch, and a second end of the second branch is not connected to a second end of the first branch.

* * * * *